United States Patent
Chang et al.

(10) Patent No.: US 6,232,177 B1
(45) Date of Patent: May 15, 2001

(54) METHOD FOR INCREASING SURFACE AREA OF A BOTTOM ELECTRODE FOR A DRAM

(75) Inventors: Ting-Chang Chang; Po-Tsun Liu, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/415,564

(22) Filed: Oct. 8, 1999

(51) Int. Cl.⁷ .............................. H01L 21/8242
(52) U.S. Cl. ............................. 438/255; 438/398
(58) Field of Search ................ 438/238, 250–256, 438/381, 393–399, 964

(56) References Cited

U.S. PATENT DOCUMENTS 5,427,974 * 6/1995 Lur et al. .
5,563,090 * 10/1996 Lee et al. .

* cited by examiner

Primary Examiner—Jey Tsai
(74) Attorney, Agent, or Firm—Thomas, Kayden, Horstemeyer & Risley

(57) ABSTRACT

A method of increasing a surface area of a bottom electrode for a DRAM. A polysilicon layer is formed. An etching process is performed and the polysilicon layer is etched into a surface having protrusions in order to increase the surface area of the polysilicon layer. A redox reaction is performed and the etched polysilicon layer is transformed to a metal layer by use of a solution; thus, the original appearance is still maintained. An annealing process is performed to concentrate the metal layer and further to reduce a thin-film leakage current.

44 Claims, 2 Drawing Sheets

METHOD FOR INCREASING SURFACE AREA OF A BOTTOM ELECTRODE FOR A DRAM

BACKGROUND OF THE INVENTION

1. Field of the Invention

The invention relates to the fabrication of a semiconductor device, and more particularly, a method for increasing a surface area of a bottom electrode for a dynamic random access memory (DRAM).

2. Description of the Related Art

Since semiconductor technique has greatly improved in recent years, a memory with a faster speed and a higher capacity has rapidly developed. In general, there are two ways to increase the capacitance of a memory. One is to use a high dielectric constant material as a dielectric layer. For example, barium strontium titanate ((Ba, Sr)TiO$_3$ or BST) having a dielectric constant of about 300–500 and a low thin-film leakage current widely applies to the DRAM of 4 Gbits and beyond. The other is to increase the efficient surface area of an electrode. Since platinum (Pt) has a low leakage current, a capacitor that consists of Pt and BST is widely adopted.

FIG. 1 is a schematic, cross-sectional view showing a bottom Pt electrode according to the prior art. Referring to FIG. 1, a semiconductor substrate 100 has a source/drain region 102. A silicon oxide layer 104 is formed on the substrate 100. The silicon oxide layer 104 has a polysilicon plug 106 that couples with the source/drain region 102. A bottom Pt electrode 110 is formed on the polysilicon plug 106. A titanium nitride barrier layer 108 is formed between the bottom Pt electrode 110 and the polysilicon plug 106.

Normally, the formation of the resulting structure comprises first depositing a Pt layer and then etching the Pt layer to form a bottom Pt electrode. However, Pt is a difficult material to etch. Thus, it is difficult to make Pt into different shapes such as a crown shape or a scale shape in order to increase the efficient surface area of the bottom electrode.

SUMMARY OF THE INVENTION

According to above, the invention provides a method of increasing the surface area of a bottom electrode for a DRAM. A Pt electrode having a desired appearance to increase the efficient surface area of the bottom electrode can be formed through a redox reaction according to the invention; thus, the traditional Pt etching process can be omitted.

This invention that provides a method of increasing the efficient surface area of a bottom electrode for a DRAM applies to a semiconductor substrate having a conductive plug electrically coupled with a conductive region. The method comprises forming a patterned silicon layer on the substrate, performing a etching process to etch a surface of the silicon layer into a surface having protrusions in order to increase a surface area of the silicon layer, performing a redox reaction to transform the silicon layer with the surface having protrusions into a metal layer by a solution while maintaining the original shape of the silicon layer, and performing an annealing process to concentrate the metal layer in order to reduce leakage current.

The invention provides a method of increasing the efficient surface area of a bottom electrode for a DRAM and a method of forming a capacitor that consists of the bottom electrode. The methods comprise the following steps. A semiconductor substrate that has a conductive plug coupled with a conductive region such as a source/drain region is provided. A barrier layer and a silicon layer are formed on the semiconductor substrate, and the barrier layer and the silicon layer are patterned to a bottom pattern aligned to the conductive plug. An etching process is performed to etch a surface of the silicon layer into a surface having protrusions in order to increase a surface area of the silicon layer. A bottom electrode with a surface having protrusions is formed by performing a redox reaction by use of a solution to transform the silicon layer with the surface having protrusions into a metal layer such as a platinum (Pt) layer or a palladium (Pd) layer while maintaining the original shape of the silicon layer. An annealing process is performed to concentrate the metal layer in order to reduce leakage current, a dielectric layer, such as a barium strontium titanate (BST) layer, having a high dielectric constant, a conductive layer such as a Pt or Pd layer is formed as a top electrode on the dielectric layer.

The invention provides a method to efficiently increase the surface area of a bottom electrode for a DRAM. The invention can provide an electrode with different shapes in order to increase the surface of the bottom electrode of a capacitor by nontraditional etching process. Thus, the invention preserves the advantage of the Pt electrode in a capacitor in increasing the capacitance of the capacitor and can apply to the DRAM process.

It is to be understood that both the foregoing general description and the following detailed description are exemplary, and are intended to provide further explanation of the invention as claimed.

DESCRIPTION OF THE PREFERRED EMBODIMENTS

Figure 1:
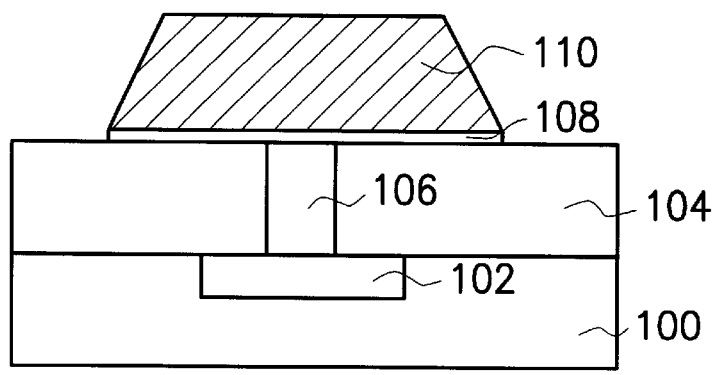
FIG. 1 is a schematic, cross-sectional view showing a bottom Pt electrode according to the prior art.
Figure 2A:
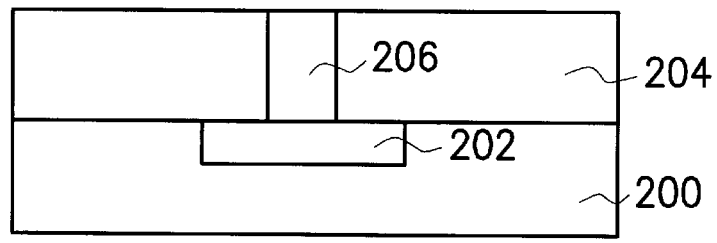
FIG. 2A through FIG. 2E are schematic, cross-sectional views showing a process according to the invention.

Referring to FIG. 2A, a semiconductor substrate 200 is provided. The semiconductor substrate 200 has a conductive region 202 such as a source/drain region. An isolation layer 204 is formed as an inter-layer dielectric layer on the substrate 200. The material used for the isolation layer 204 is, for example, silicon oxide, spin-on glass, or other materials with low dielectric constants. The isolation layer 204 has a conductive plug 206 that couples with the conductive region 202. The material used for the conductive plug 206 is, for example, polysilicon or doped polysilicon.

The resulting structure is constructed by first forming the isolation layer 204 on the semiconductor substrate 200 and then forming an opening on the isolation layer 204 by photolithography and etching. The opening is filled with a conductive material to form the conductive plug 206. Since the fabrication of the resulting structure is a well-known art, the details are not described here.

The invention only uses the fabrication of a bottom electrode as an example in order to describe the invention and the details thereof, and the invention is not restricted to this embodiment or to the electrode structure disclosed as follows.

Figure 2B:
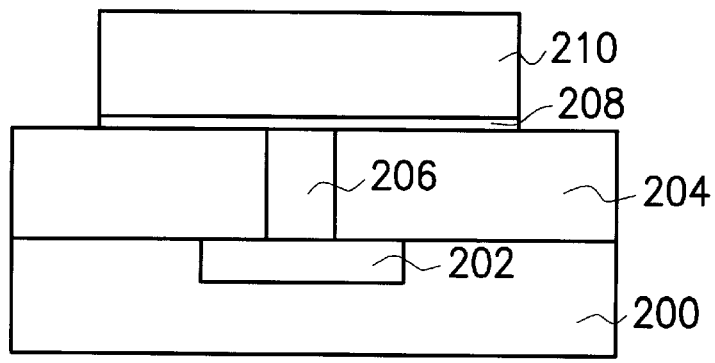

Referring to FIG. 2B, a barrier layer 208 such as a titanium nitride layer is selectively formed on the semiconductor substrate 200. The barrier layer 208 not only increases the adhesion between the dielectric layer 204 and a later-formed metal bottom electrode, but also prevents the later-formed metal bottom electrode from diffusing into the dielectric layer 204. A patterned silicon layer 210 is formed over the semiconductor substrate 200. The silicon layer comprises a polysilicon layer or an amorphous silicon layer. The silicon layer 210 is formed by, for example, chemical vapor deposition to a thickness of about 1000–10000 Å. The preferred thickness is about 4000–6000 Å. The silicon layer 210 is patterned to a desired pattern aligned to the conductive plug 206 by photolithography and etching, and the barrier layer 208 is also patterned at this step.

Figure 2C:
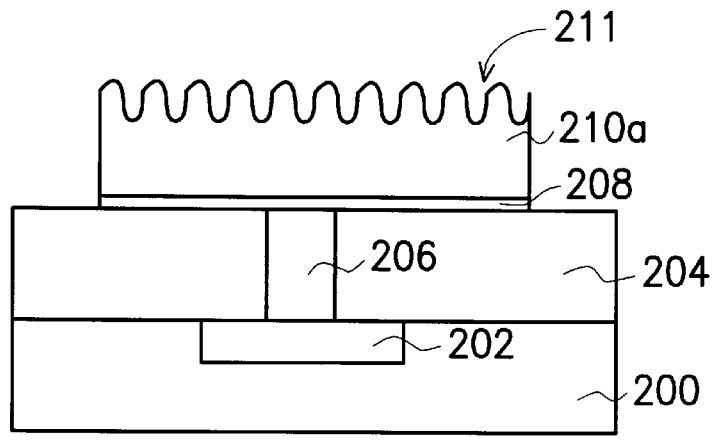

Referring to FIG. 2C, an etching process such as dry etching or wet etching is performed to etch the silicon layer 210 into a silicon layer 210a with a surface 211 having protrusions. The surface 211 having protrusions is, for example, crown-shaped, scale-shaped etc. The etching agent used in wet etching is a HF/HNO$_3$/H$_2$O mixture with a ratio of about 1:2–5:3–10.

Figure 2D:
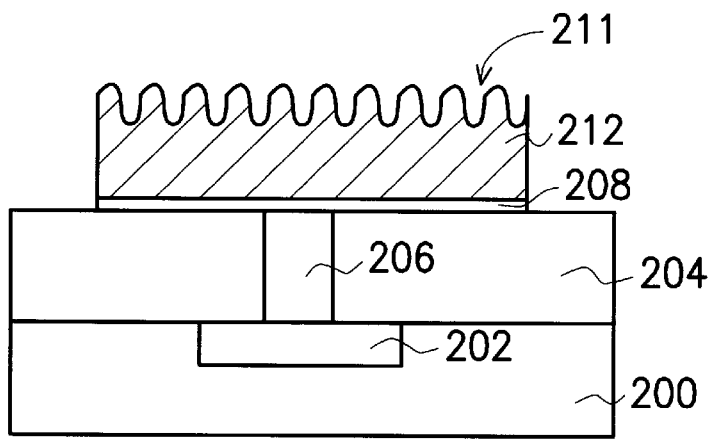

Referring to FIG. 2D, a redox reaction is performed to transform the surface 211 having protrusions of the silicon layer 210a into a metal layer 212 while maintaining the original appearance of the silicon layer 210a. The metal layer 212 comprises a metal reduced by the redox reaction. The reduced metal is, for example, platinum (Pt), palladium (Pd), iridium (Ir), rhodium (Rh), or ruthenium (Ru). In the case of Pt, the solution is, for example, a K$_2$PtCl$_4$/HF mixture. The redox reaction is described as follows:

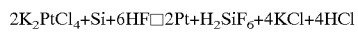

2K$_2$PtCl$_4$+Si+6HF□2Pt+H$_2$SiF$_6$+4KCl+4HCl

Figure 2E:
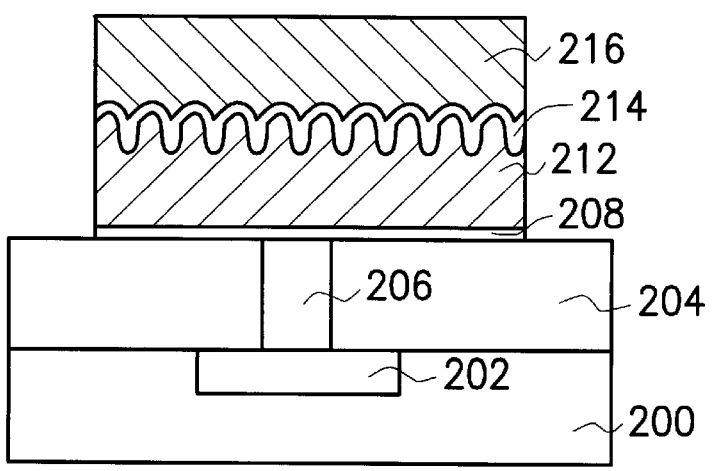

According to above, a bottom electrode with different appearances is formed. Thus, the efficient surface area of the bottom electrode of a capacitor is greatly increased, the advantage of a Pt electrode is preserved, and the capacitance of the capacitor is efficiently increased. According to the invention, an annealing process comprising placing a wafer that consists of the substrate 200 in an oven and performing a rapid thermal process to concentrate the metal layer 212 is performed to strengthen the metal layer 212 and to reduce the leakage current Referring to FIG. 2E, a capacitor dielectric layer 214 is formed on the metal layer 212. The material used for the capacitor layer 214 is, for example, barium strontium titanate (BST) with a high dielectric constant. The capacitor dielectric layer 214 is formed by, for example, sol-gel spin coating, chemical vapor deposition, or metalorganic chemical vapor deposition. A conductive layer 216 is formed on the capacitor dielectric layer 214. The material used for the conductive layer 216 is, for example, the same material as the bottom electrode (Pt or Pd) or other conductive materials such as RuO$_2$. The conductive layer 216 is used as a top electrode. Thus, a capacitor is completed.

The invention provides a method to efficiently increase the surface area of a bottom electrode for a DRAM. The invention can provide an electrode with different shapes in order to increase the surface of the bottom electrode of a capacitor by nontraditional etching process. Thus, the invention preserves the advantage of the Pt electrode in a capacitor in increasing the capacitance of the capacitor and can apply to the DRAM process.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of increasing a surface area of a bottom electrode for a dynamic random access memory (DRAM) wherein the method applies to a semiconductor substrate having a conductive plug coupled with a conductive region and comprises:

forming a silicon layer on the substrate;

performing a etching process to etch a surface of the silicon layer into a surface having protrusions; and performing a redox reaction to transform the silicon layer with the surface having protrusions into a metal layer by use of a solution.

2. The method of claim 1, wherein the silicon layer comprises a polysilicon layer.

3. The method of claim 1, wherein the silicon layer comprises an amorphous silicon layer.

4. The method of claim 1, wherein the silicon layer has a thickness of about 4000–6000 Å.

5. The method of claim 1, wherein the etching process comprises dry etching.

6. The method of claim 1, wherein the etching process comprises wet etching.

7. The method of claim 6, wherein an etching agent used in the wet etching comprises a HF/HNO$_3$/H$_2$O mixture.

8. The method of claim 7, wherein the HF/HNO$_3$/H$_2$O mixture has a ratio of about 1:2–5:3–10.

9. The method of claim 1, wherein the solution comprises a K$_2$PtCl$_4$/HF mixture.

10. The method of claim 1, wherein the metal layer comprises a platinum layer.

11. The method of claim 1, wherein the metal layer comprises a palladium layer.

12. The method of claim 1, wherein the method further comprises an annealing process to concentrate the metal layer after forming the metal layer.

13. A fabrication method of a bottom electrode for a DRAM, the method comprising:

providing a semiconductor substrate that has a conductive plug coupled with a conductive region;

forming a barrier layer and a silicon layer on the semiconductor substrate in sequence;

patterning the barrier layer and the silicon layer;

performing an etching process to etch a surface of the silicon layer into a surface having protrusions; and performing a redox reaction to transform the silicon layer with the surface having protrusions into a metal layer by use of a solution.

14. The fabrication method of claim 13, wherein a material used for the conductive plug comprises polysilicon.

15. The fabrication method of claim 13, wherein the conductive region comprises a source/drain region.

16. The fabrication method of claim 13, wherein the barrier layer comprises a titanium nitride layer.

17. The fabrication method of claim 13, wherein the silicon layer comprises a polysilicon layer.

18. The fabrication method of claim 13, wherein the silicon layer comprises an amorphous silicon layer.

19. The fabrication method of claim 13, wherein the silicon layer has a thickness of about 4000–6000 Å.

20. The fabrication method of claim 13, wherein the etching process comprises dry etching.

21. The fabrication method of claim 13, wherein the etching process comprises wet etching.

22. The fabrication method of claim 21, wherein an etching agent used in the wet etching comprises a HF/HNO$_3$/H$_2$O mixture.

23. The fabrication method of claim 22, wherein the HF/HNO$_3$/H$_2$O mixture has a ratio of about 1:2–5:3–10.

24. The fabrication method of claim 13, wherein the solution comprises a K$_2$PtCl$_4$/HF mixture.

25. The fabrication method of claim 13, wherein the metal layer comprises a platinum layer.

26. The fabrication method of claim 13, wherein the metal layer comprises a palladium layer.

27. The fabrication method of claim 13, wherein the method further comprises an annealing process to concentrate the metal layer after forming the metal layer.

28. A fabrication method of a capacitor for a DRAM, the method comprising:

provarding a semiconductor substrate that has a conductive region;

forming an isolation layer on the substrate;

forming an opening in the isolation layer to expose the substrate;

filling the opening with a conductive material to form a conductive plug;

forming a barrier layer and a silicon layer on the semiconductor substrate insequence;

patterning the barrier layer and the silicon layer;

performing an etching process to etch a surface of the silicon layer into a surface having protrusions;

performing a redox reaction to transform the silicon layer with the surface having protrusions into a metal layer by use of a solution;

performing an annealing process to concentrate the metal layer;

forming a capacitor dielectric layer on the surface of the metal layer; and forming a conductive layer on the capacitor dielectric layer.

29. The fabrication method of claim 28, wherein a material used for the conductive plug comprises polysilicon.

30. The fabrication method of claim 28, wherein the conductive region comprises a source/drain region.

31. The fabrication method of claim 28, wherein the barrier layer comprises a titanium nitride layer.

32. The fabrication method of claim 28, wherein the silicon layer comprises a polysilicon layer.

33. The fabrication method of claim 28, wherein the silicon layer comprises an amorphous silicon layer.

34. The fabrication method of claim 28, wherein the silicon layer has a thickness of about 4000–6000 Å.

35. The fabrication method claim 28, wherein the etching process comprises dry etching.

36. The fabrication method of claim 28, wherein the etching process comprises wet etching.

37. The fabrication method of claim 36, wherein an etching agent used in the wet etching comprises a $HF/HNO_3/H_2O$ mixture.

38. The fabrication method of claim 37, wherein the $HF/HNO_3/H_2O$ mixture has a ratio of about 1:2–5:3–10.

39. The fabrication method of claim 28, wherein the solution comprises a $K_2PtCl_4/HF$ mixture.

40. The fabrication method of claim 28, wherein the metal layer comprises a platinum layer.

41. The fabrication method of claim 28, wherein the metal layer comprises a palladium layer.

42. The fabrication method of claim 28, wherein the capacitor dielectric layer comprises a barium strontium titanate.

43. The fabrication method of claim 28, wherein the conductive layer comprises a platinum layer.

44. The fabrication method of claim 28, wherein the conductive layer comprises a palladium layer.

* * * * *